(12) United States Patent
Chen et al.

(10) Patent No.: US 11,201,440 B2
(45) Date of Patent: Dec. 14, 2021

(54) POWER SUPPLY DEVICE

(71) Applicant: SHENZHEN RELX TECHNOLOGY CO., LTD., Shenzhen (CN)

(72) Inventors: Chen Chen, Shenzhen (CN); Shengren Wang, Shenzhen (CN); Jiaqi Fu, Shenzhen (CN)

(73) Assignee: SHENZHEN RELX TECHNOLOGY CO., LTD., Shenzhen (CN)

( * ) Notice: Subject to any disclaimer, the term of this patent is extended or adjusted under 35 U.S.C. 154(b) by 39 days.

(21) Appl. No.: 16/658,144

(22) Filed: Oct. 20, 2019

(65) Prior Publication Data
US 2021/0036468 A1 Feb. 4, 2021

(30) Foreign Application Priority Data
Aug. 1, 2019 (CN) .......................... 201921249876.4

(51) Int. Cl.
| | |
|---|---|
| *H02J 9/06* | (2006.01) |
| *H01R 13/66* | (2006.01) |
| *H05K 7/14* | (2006.01) |
| *G06F 1/18* | (2006.01) |
| *H05K 9/00* | (2006.01) |

(52) U.S. Cl.
CPC ............ *H01R 13/6666* (2013.01); *H02J 9/06* (2013.01); *G06F 1/183* (2013.01); *H05K 7/142* (2013.01); *H05K 9/005* (2013.01)

(58) Field of Classification Search
CPC ....... H01R 13/6666; H02J 9/06; H05K 9/005; H05K 7/142; G06F 1/183
See application file for complete search history.

(56) References Cited

U.S. PATENT DOCUMENTS

| | | | | |
|---|---|---|---|---|
| 6,317,332 B1* | 11/2001 | Weber | ................ | B60R 16/0239 |
| | | | | 310/71 |
| 7,248,468 B1* | 7/2007 | Hsu | ......................... | G06F 1/181 |
| | | | | 174/544 |
| 7,817,020 B2* | 10/2010 | Turnbull | .................. | B60Q 3/20 |
| | | | | 340/438 |
| 8,282,412 B1* | 10/2012 | Yaguchi | ............. | H01R 13/5804 |
| | | | | 439/492 |
| 2005/0146871 A1* | 7/2005 | Schuttinger | ............ | G02B 25/02 |
| | | | | 362/235 |

(Continued)

*Primary Examiner* — Tho D Ta
(74) *Attorney, Agent, or Firm* — Idea Intellectual Limited; Margaret A. Burke; Sam T. Yip

(57) ABSTRACT

Embodiments of the present application relate to a power supply device, including a housing, a circuit board and a connecting assembly. The housing defines an accommodation space, and includes: a housing positioning component, a first opening, and a second opening. The housing positioning component is disposed in the accommodation space. The circuit board is disposed in the accommodation space, and includes: a circuit board positioning component, a power input port, and a power output port. The power input port is disposed corresponding to the first opening. The power output port is disposed corresponding to the second opening, and electrically connected to the power output port. The connecting assembly is configured to connect the housing positioning component and the circuit board positioning component, and position the circuit board in the accommodation space of the housing.

21 Claims, 22 Drawing Sheets

(56) References Cited

U.S. PATENT DOCUMENTS

| | | | | |
|---|---|---|---|---|
| 2005/0148237 A1* | 7/2005 | Nobori | ................... | H01L 24/83 |
| | | | | 439/607.01 |
| 2007/0207672 A1* | 9/2007 | Takagi | ................... | B06B 1/045 |
| | | | | 439/607.01 |
| 2010/0142163 A1* | 6/2010 | Uemura | ................ | H05K 7/142 |
| | | | | 361/752 |
| 2011/0051413 A1* | 3/2011 | Hand | ........................ | F21K 9/60 |
| | | | | 362/235 |
| 2011/0059661 A1* | 3/2011 | Inomata | ................ | H05K 3/325 |
| | | | | 439/841 |
| 2012/0113603 A1* | 5/2012 | Tokunaga | .......... | H05K 7/20445 |
| | | | | 361/752 |

\* cited by examiner

POWER SUPPLY DEVICE

CROSS REFERENCE TO RELATED APPLICATIONS

The present application claims the benefit of priority from the China Patent Application No. 201921249876.4, filed on 1 Aug. 2019, the disclosure of which is hereby incorporated by reference in its entirety.

BACKGROUND

1. Technical Field

The present application relates to the field of electronic cigarette technologies, and more particularly to a power supply device of an electronic cigarette.

2. Description of the Related Art

Electronic cigarette technologies are developing rapidly. An electronic cigarette mainly uses a built-in rechargeable battery to provide power required by internal electronic elements, allowing the user to perform related operations on electronic cigarettes. For ease of carrying, an electronic cigarette is generally smaller in size than common electronic devices. Therefore, a power supply device for use in combination with the built-in rechargeable battery of the electronic cigarette needs to be re-designed.

SUMMARY

Some embodiments of the present application provide a power supply device, including a housing, a circuit board, and a connecting assembly. The housing defines an accommodation space, and includes: a housing positioning component, a first opening, and a second opening. The housing positioning component is disposed in the accommodation space. The circuit board is disposed in the accommodation space, and includes a circuit board positioning component, a power input port, and a power output port. The power input port is disposed corresponding to the first opening. The power output port is disposed corresponding to the second opening. The connecting assembly is configured to connect the housing positioning component and the circuit board positioning component, and position the circuit board in the accommodation space of the housing.

BRIEF DESCRIPTION OF THE DRAWINGS

The present application will be described according to the appended drawings in which.

DETAILED DESCRIPTION

To make the objectives, the technical solutions, and the advantages of the present application more comprehensible, the following further describes the present application in detail with reference to specific embodiments and the accompanying drawings. It is to be appreciated by those skilled in the art that the present application is not limited to the accompanying drawings and the following embodiments.

Figure 1A:
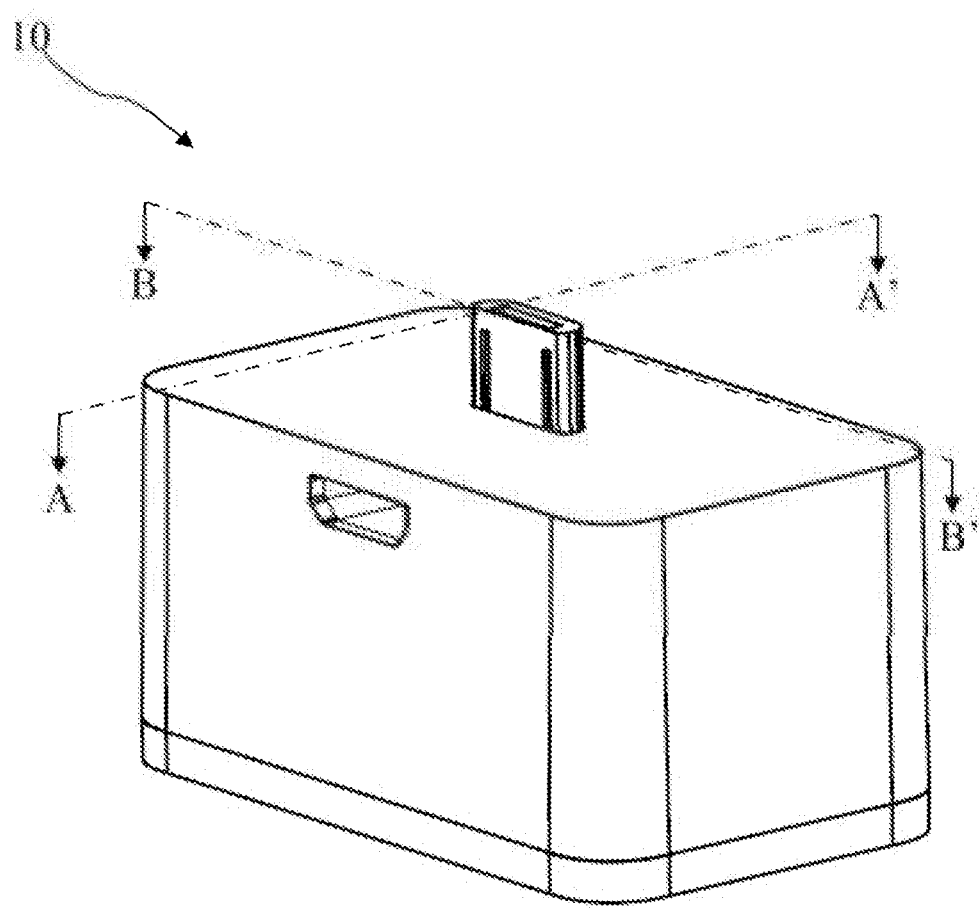
FIG. 1A is a three-dimensional diagram of a power supply device according to some embodiments of the present application.
Figure 1B:
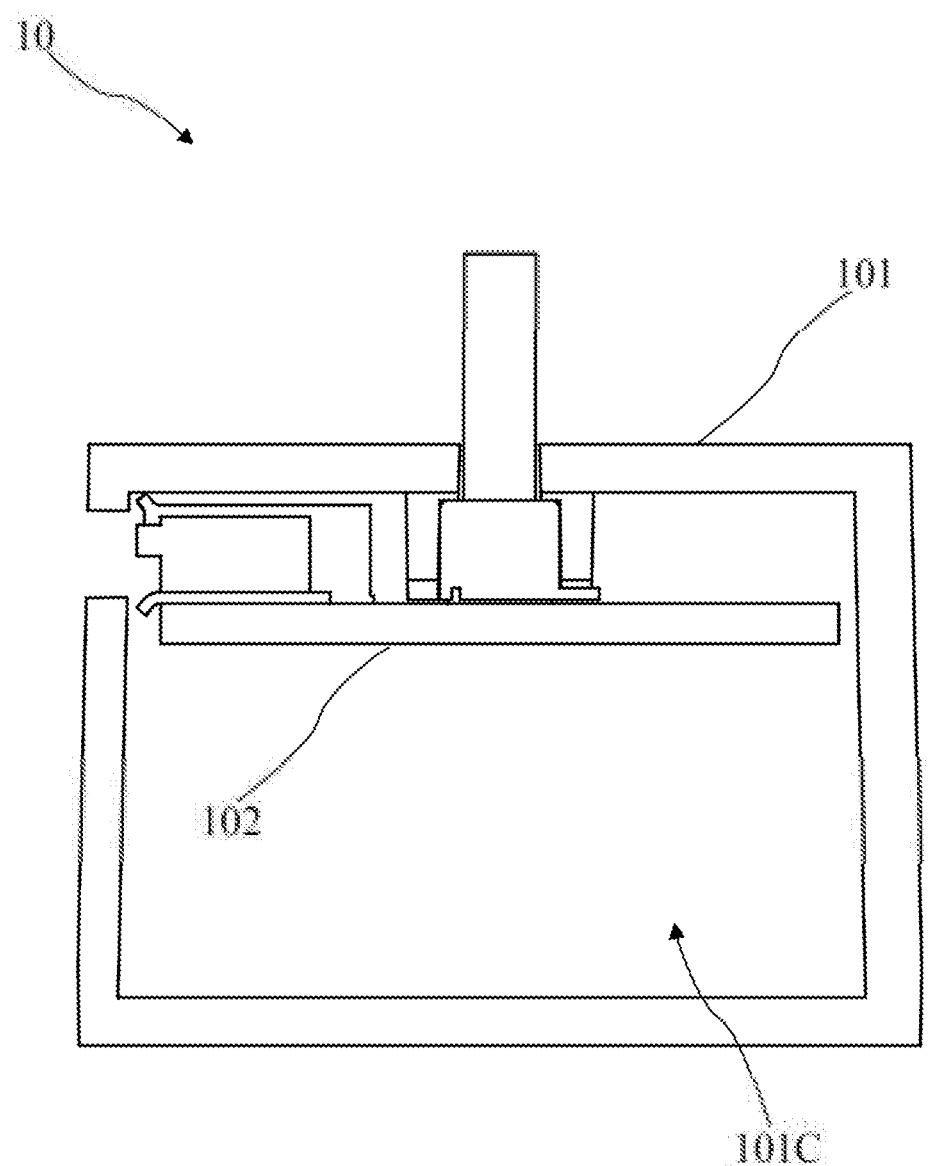
FIG. 1B is a cross-sectional view of the power supply device taken along line A-A' in FIG. 1A according to some embodiments of the present application.
Figure 1C:
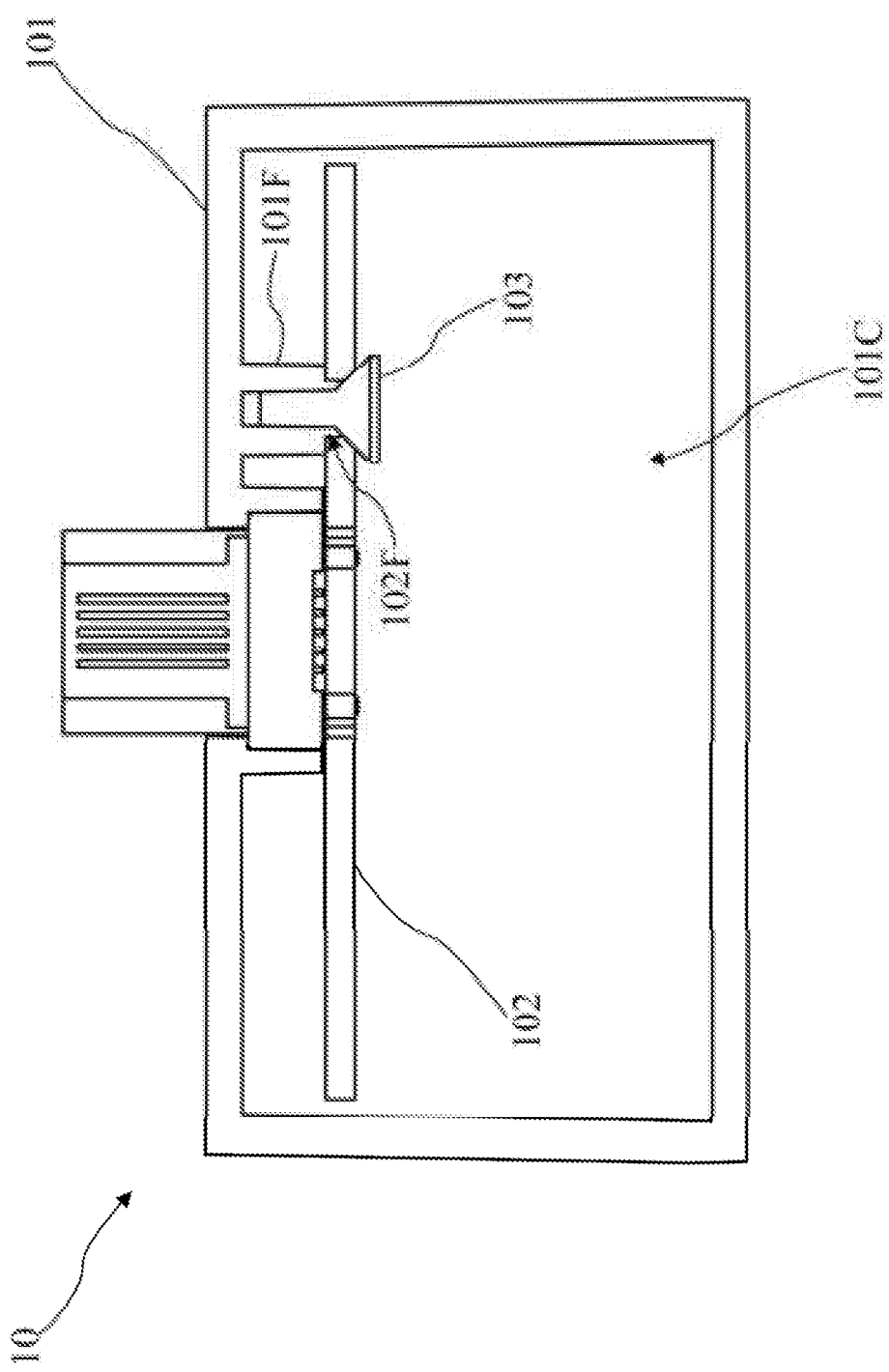
FIG. 1C is a cross-sectional view of the power supply device taken along line B-B' in FIG. 1A according to some embodiments of the present application.

With reference to FIG. 1A to FIG. 1C, FIG. 1A is a three-dimensional diagram of a power supply device 10 according to the present application, FIG. 1B is a cross-sectional view of the power supply device 10 taken along line A-A' in FIG. 1A according to the present application, and FIG. 1C is a cross-sectional view of the power supply device 10 taken along line B-B' in FIG. 1A according to the present application. As shown in the figures, the power supply device 10 includes a housing 101, a circuit board 102 and a connecting assembly 103. The housing 101 defines an accommodation space 101C, configured to accommodate the circuit board 102. The housing 101 includes a housing positioning component 101F disposed in the accommodation space 101C. A circuit board positioning component 102F is formed on the circuit board 102. The connecting assembly 103 is configured to connect the housing positioning component 101F and the circuit board positioning component 102F, so as to position the circuit board 102 in the accommodation space 101C of the housing 101.

In some embodiments, the connecting assembly 103 includes a male part of a fastener group, the circuit board positioning component 102F is a through hole formed on the circuit board 102, and the housing positioning component 101F includes a female part of the fastener group corresponding to the connecting assembly 103. Therefore, after the connecting assembly 103 is passed through the circuit board positioning component 102F and connected to the housing positioning component 101F, the circuit board 102 is fixed in the accommodation space 101C of the housing 101.

In particular, the male part included in the connecting assembly 103 has two ends, a cross section of one end is smaller than the through hole of the circuit board 102, and a cross section of the other end is larger than the through hole of the circuit board 102. In this way, when one end of the male part is passed through the through hole of the circuit board 102 and engaged with the female part included in the housing positioning component 101F, the other end of the male part presses against the circuit board 102, so that the circuit board 102 is fixed in the accommodation space 101C.

Figure 1D:
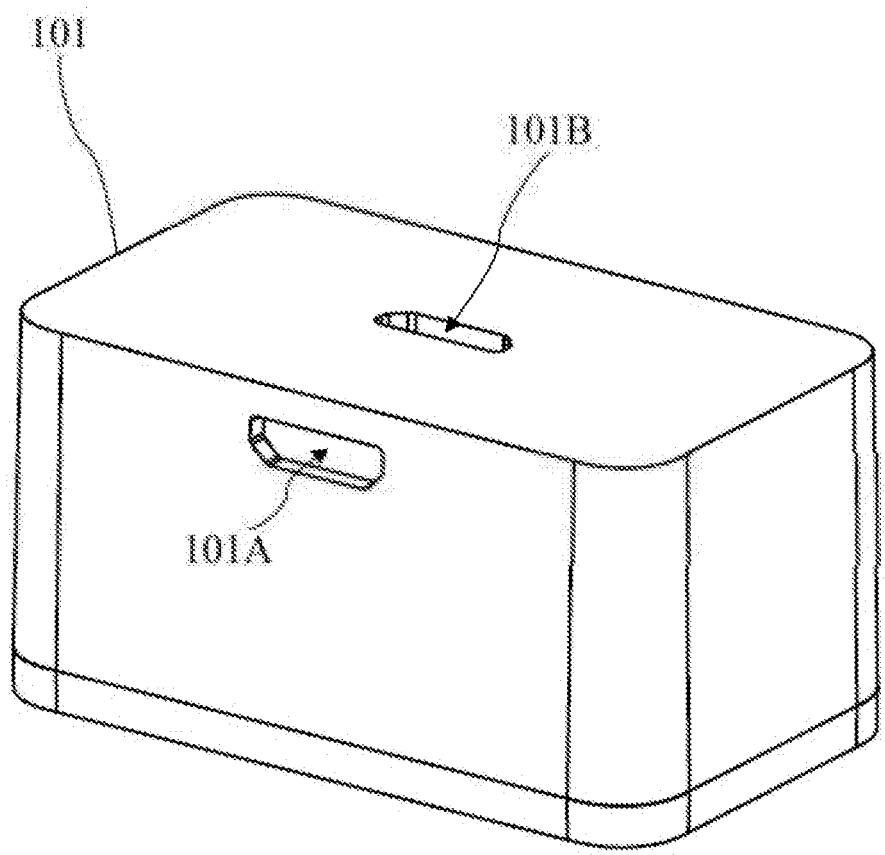
FIG. 1D is a three-dimensional diagram of a housing of the power supply device according to some embodiments of the present application.
Figure 1E:
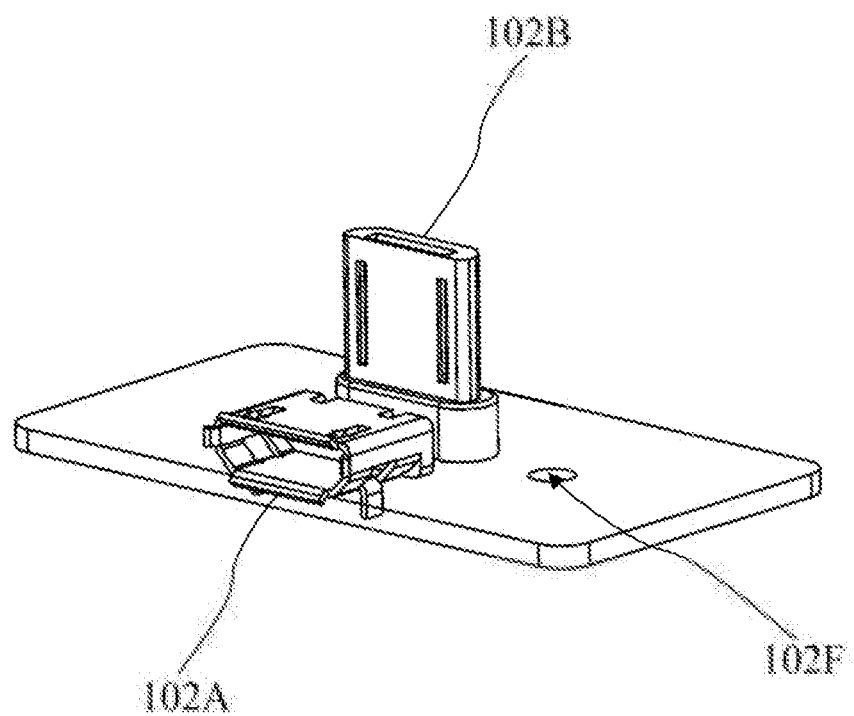
FIG. 1E is a three-dimensional diagram of a circuit board of the power supply device according to some embodiments of the present application.
Figure 1F:
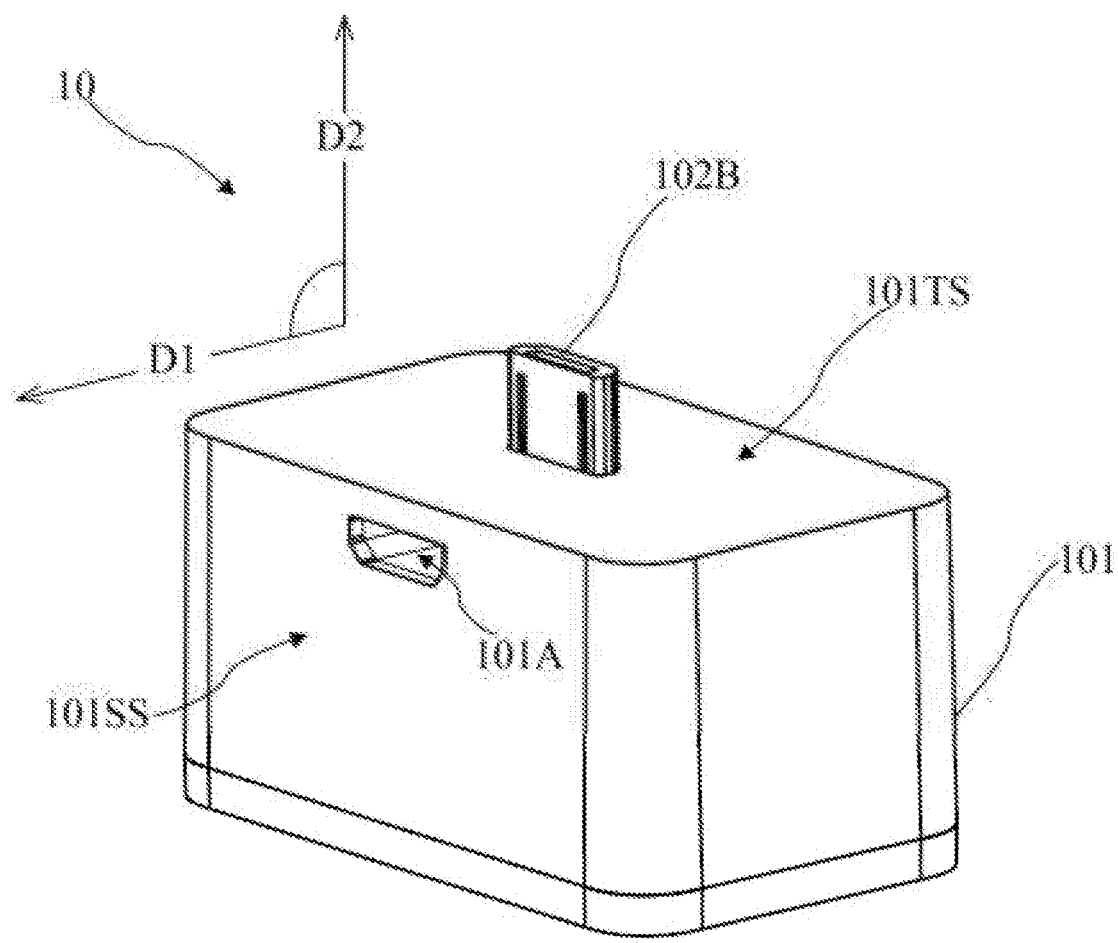
FIG. 1F is another three-dimensional diagram of the power supply device according to some embodiments of the present application.

With reference to FIG. 1D, FIG. 1E and FIG. 1F, FIG. 1D is a three-dimensional diagram of the housing 101 according to the present application, FIG. 1E is a three-dimensional diagram of the circuit board 102 according to the present application, and FIG. 1F is another three-dimensional diagram of the power supply device 10 according to the present application. As shown in FIG. 1D, an opening 101A and an opening 101B are formed on the housing 101. As shown in FIG. 1E, an electronic element is configured on the circuit board 102. The electronic element includes a power input port 102A and a power output port 102B. The circuit board positioning component 102F is formed on one side of the power output port 102B. As shown in FIG. 1F, when the circuit board 102 is fixedly disposed in the accommodation space 101C of the housing 101, the position of the power input port 102A corresponds to the position where the opening 101A is formed in the housing 101, and the position of the power output port 102B corresponds to the position where the opening 101B is formed in the housing 101. Therefore, the power input port 102A is exposed to the opening 101A, and the power output port 102B is exposed to the opening 101B.

In this way, through the opening 101A, the power input port 102A is connected to a power input element (for example, a transformer) by a transmission wire, and receives power supplied by the power input element. The power input port 102A is electrically connected to the power output port 102B through a circuit on the circuit board 102. The circuit converts the power and provides the converted power to the power output port 102B. On the other hand, through the opening 101B, the power output port 102B is connected to an electronic device, and provides the converted power to the electronic device (for example, an electronic cigarette).

In some embodiments, the power output port 102B is a male port, which extends through the opening 102B and protrudes from an outer surface of the housing 101, to connect to a female port of the electronic device.

In some embodiments, the opening 101B is formed on a top surface 101TS of the housing 101, and the opening 101A is formed on a side surface 101SS of the housing 101. The top surface 101TS is adjacent to the side surface 101SS. On the other hand, the power input port 102A receives a power input element along a direction D1, and the power output port 102B receives an electronic device along a direction D2. In some embodiments, an angle between the direction D1 and the direction D2 is about 45 degrees to 135 degrees. In some embodiments, the angle between the direction D1 and the direction D2 is about 45 degrees, 60 degrees, 75 degrees or 90 degrees.

Figure 2A:
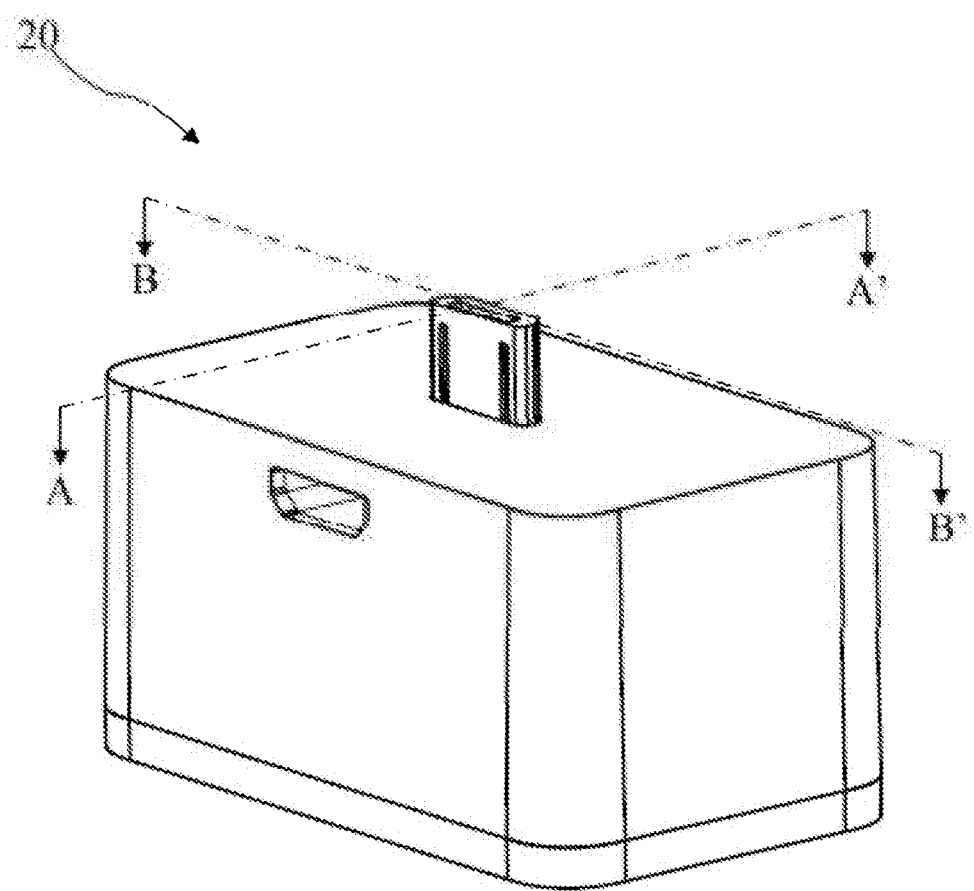
FIG. 2A is a three-dimensional diagram of a power supply device according to some embodiments of the present application.
Figure 2B:
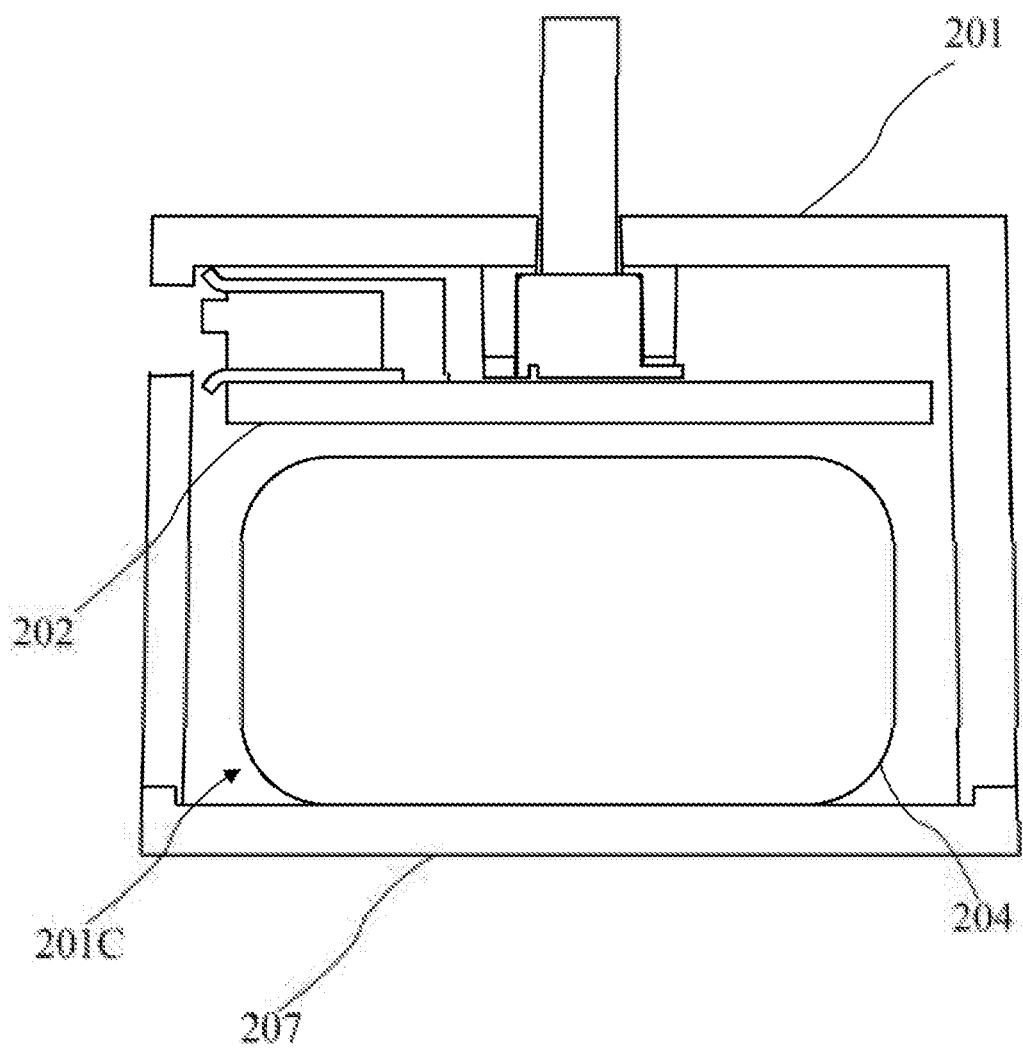
FIG. 2B is a cross-sectional view of the power supply device taken along line A-A' in FIG. 2A according to some embodiments of the present application.
Figure 2C:
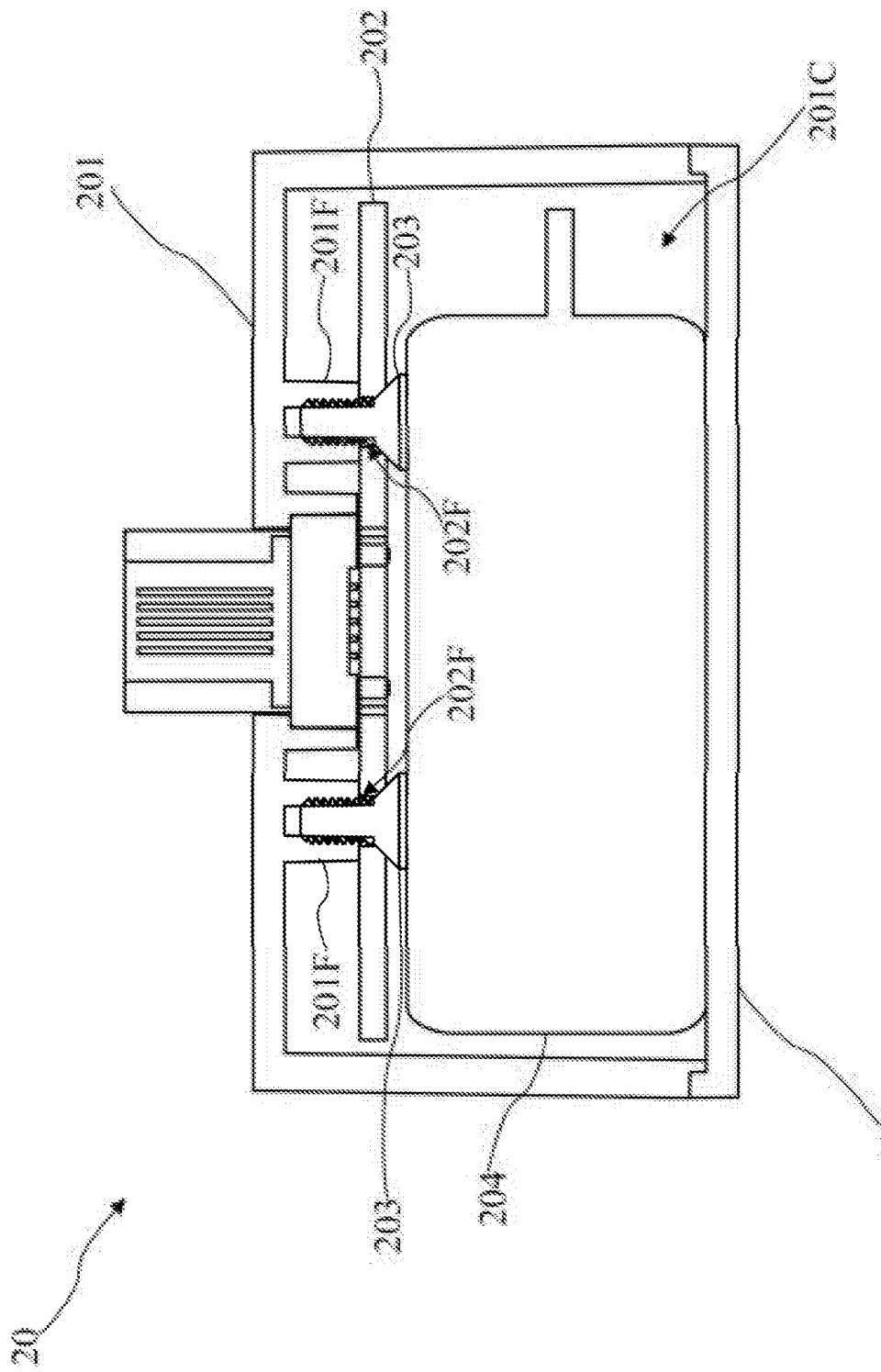
FIG. 2C is a cross-sectional view of the power supply device taken along line B-B' in FIG. 2A according to some embodiments of the present application.
Figure 2D:
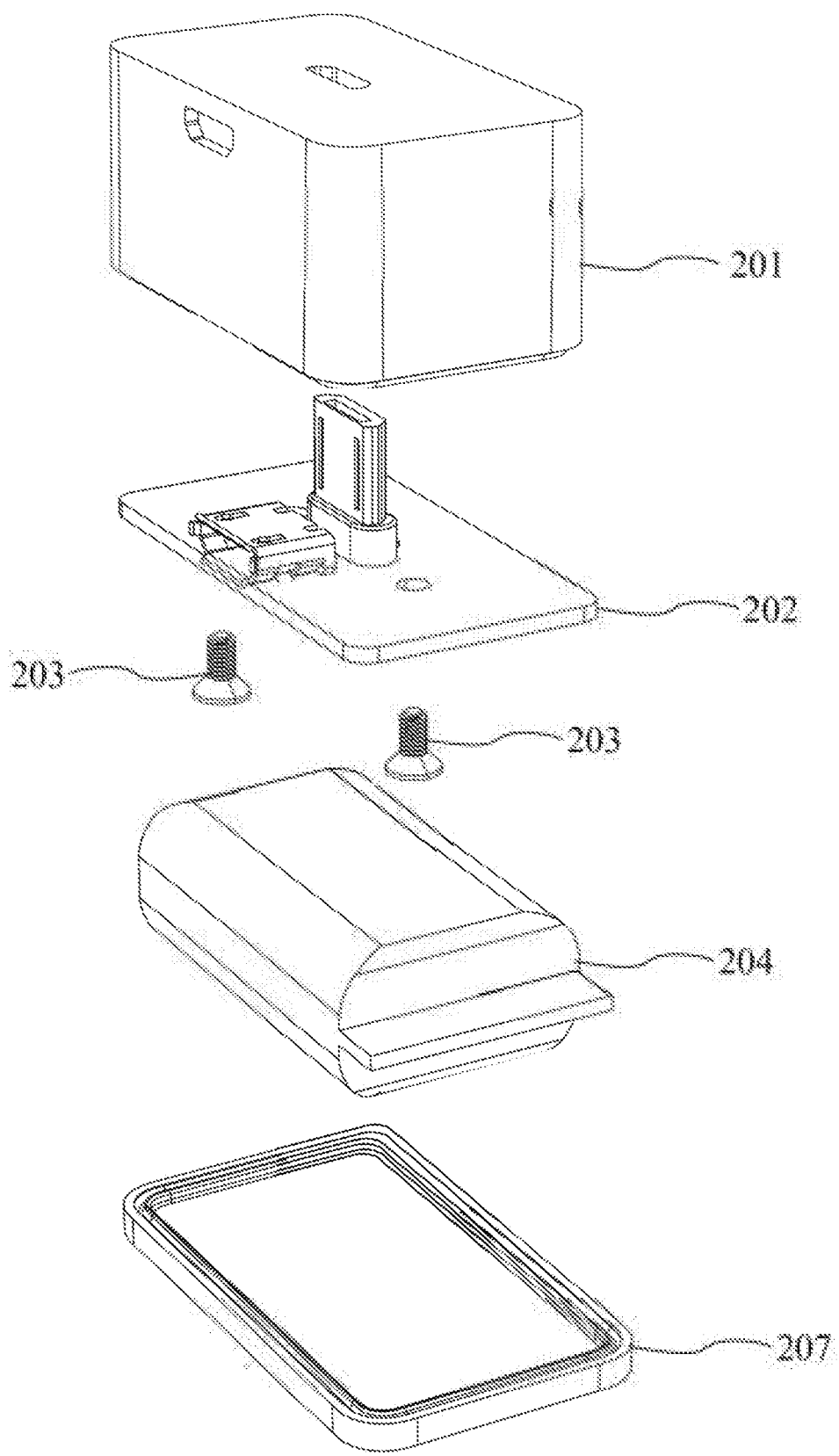
FIG. 2D is an exploded view of the power supply device according to some embodiments of the present application.

With reference to FIG. 2A to FIG. 2D, FIG. 2A is a three-dimensional diagram of a power supply device 20 according to the present application, FIG. 2B is a cross-sectional view of the power supply device 20 taken along line A-A' in FIG. 2A according to the present application, FIG. 2C is a cross-sectional view of the power supply device 20 taken along line B-B' in FIG. 2A according to the present application, and FIG. 2D is an exploded view of the power supply device 20 according to the present application. As shown in the figures, the power supply device 20 includes a housing 201, a circuit board 202, a connecting assembly 203 and a power storage element 204. The housing 201 defines an accommodation space 201C, configured to accommodate the circuit board 202 and the power storage element 204.

Specifically, the housing 201 includes a housing positioning component 201F disposed in the accommodation space 201C. A circuit board positioning component 202F is formed on the circuit board 202. The connecting assembly 203 is configured to connect the housing positioning component 201F and the circuit board positioning component 202F, so as to fix the circuit board 202 in the accommodation space 201C of the housing 201.

In some embodiments, the connecting assembly 203 includes male parts (for example, two screws in the figures) of two fastener groups, the circuit board positioning component 202F includes two through holes, and the housing positioning component 201F includes female parts (for example, two screw holes in the figures) of the fastener groups corresponding to the connecting assembly 203. Therefore, after the two male parts are respectively passed through the two through holes of the circuit board 202 and connected to the female parts of the housing 201, the circuit board 202 is fixed in the accommodation space 201C of the housing 201.

In addition, the accommodation space 201C of the housing 201 further includes a space configured to accommodate the power storage element 204. As shown in the figures, the power storage element 204 is disposed between the circuit board 201 and a bottom portion of the housing 201. The bottom portion of the housing 201 is provided with a bottom cap 207, removably disposed at the bottom portion of the housing 201, and configured to close the accommodation space 201C of the housing 201 after elements (for example, the circuit board 202, the connecting assembly 203, and the power storage element 204) are disposed in the housing 201.

Figure 2E:
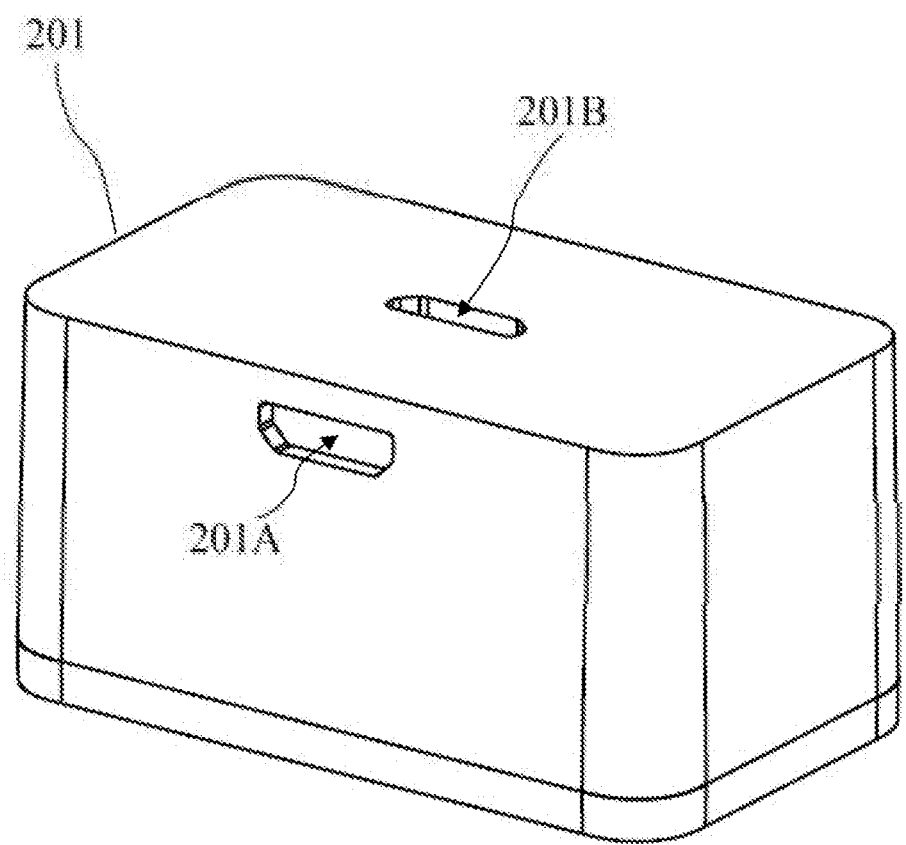
FIG. 2E is a three-dimensional diagram of a housing of the power supply device according to some embodiments of the present application.
Figure 2F:
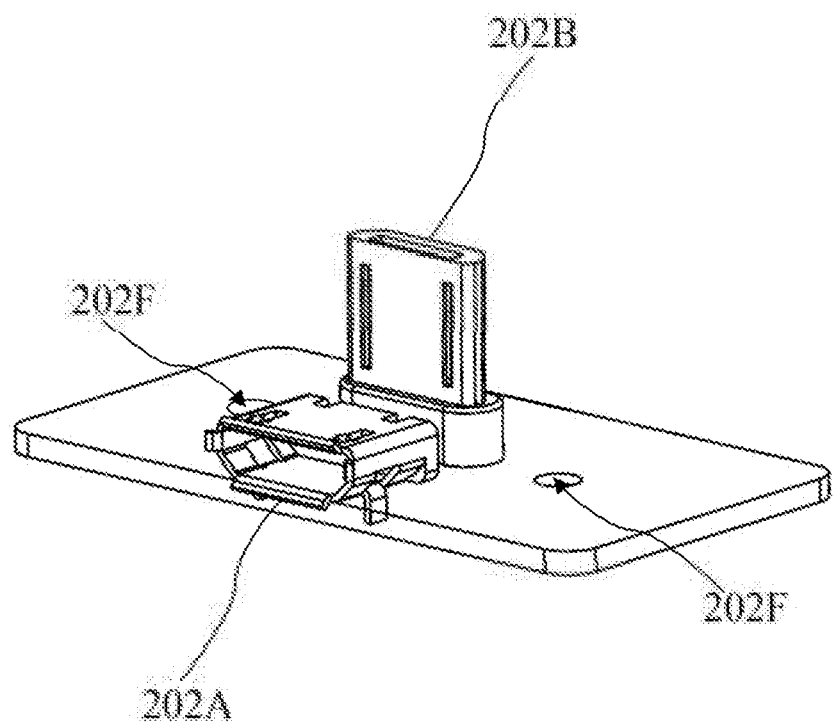
FIG. 2F is a three-dimensional diagram of a circuit board of the power supply device according to some embodiments of the present application.
Figure 2G:
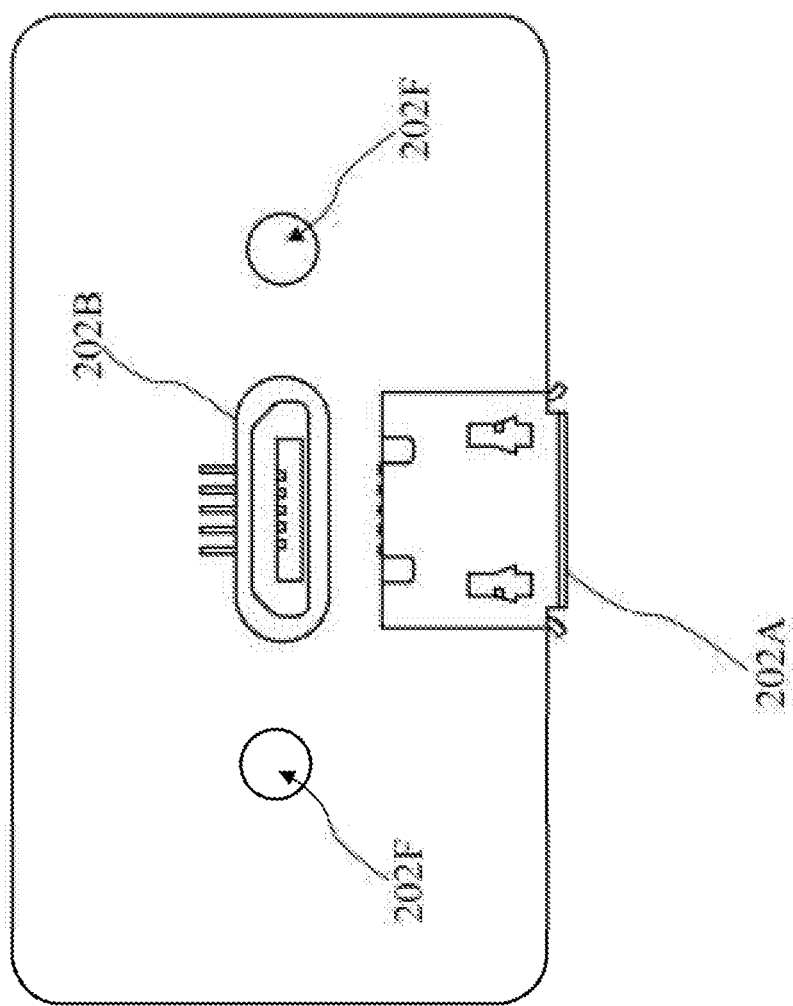
FIG. 2G is a top view of the circuit board of the power supply device according to some embodiments of the present application.
Figure 2H:
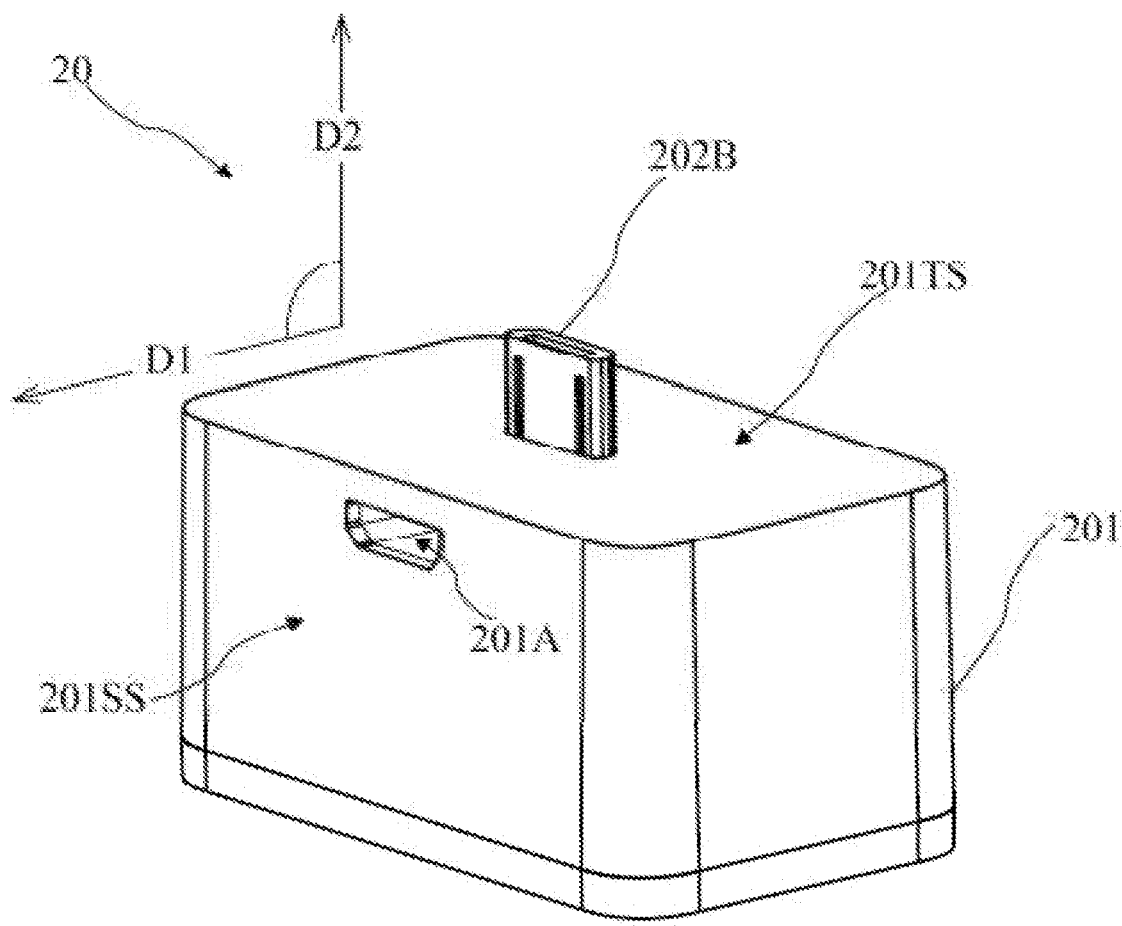
FIG. 2H is another three-dimensional diagram of the power supply device according to some embodiments of the present application.

With reference to FIG. 2E to FIG. 2H, FIG. 2E is a three-dimensional diagram of the housing 201 according to the present application, FIG. 2F is a three-dimensional diagram of the circuit board 202 according to the present application, FIG. 2G is a top view of the circuit board 202 according to the present application, and FIG. 2H is another three-dimensional diagram of the power supply device 20 according to the present application. As shown in FIG. 2E, an opening 201A and an opening 201B are formed on the housing 201. As shown in FIG. 2F and FIG. 2G, an electronic element is configured on the circuit board 202. The electronic element includes a power input port 202A and a power output port 202B. The circuit board positioning component 202F is disposed on two sides of the power output port 202B. As shown in FIG. 2H, when the circuit board 202 is fixedly disposed in the accommodation space 201C of the housing 201, the position of the power input port 202A corresponds to the position where the opening 201A is formed in the housing 201, and the position of the power output port 202B corresponds to the position where the opening 201B is formed in the housing 201. Therefore, the power input port 202A is exposed to the opening 201A, and the power output port 202B is exposed to the opening 201B.

In this way, through the opening 201A, the power input port 202A is connected to a power input element (for example, a transformer) by a transmission wire, and receives power supplied by the power input element. The power input port 202A is electrically connected to the power output port 202B through a circuit on the circuit board 202. The circuit converts the power and provides the converted power to the power output port 202B. On the other hand, through the opening 201B, the power output port 202B is connected to an electronic device, and provides the converted power to the electronic device (for example, an electronic cigarette). In some embodiments, the power output port 202B is a male port, which extends through the opening 202B and protrudes from an outer surface of the housing 201 to connect to a female port of the electronic device.

In some embodiments, the power storage element 204 is electrically connected to the power input port 202A and the power output port 202B of the circuit board 202. The power storage element 204 is configured to: store the power supplied by the power input element through the power input port 202A, and provide the stored power to the electronic device when the electronic device is connected to the power output port 202B.

In some embodiments, the opening 201B is formed on the top surface 201TS of the housing 201, and the opening 201A is formed on the side surface 201SS of the housing 201. The top surface 201TS is adjacent to the side surface 201SS. On the other hand, the power input port 202A receives a power input element along a direction D1, and the power output port 202B receives an electronic device along a direction D2. In some embodiments, an angle between the direction D1 and the direction D2 is from 45 degrees to 135 degrees. In some embodiments, the angle between the direction D1 and the direction D2 is approximately 45 degrees, 60 degrees, 75 degrees or 90 degrees.

Figure 3A:
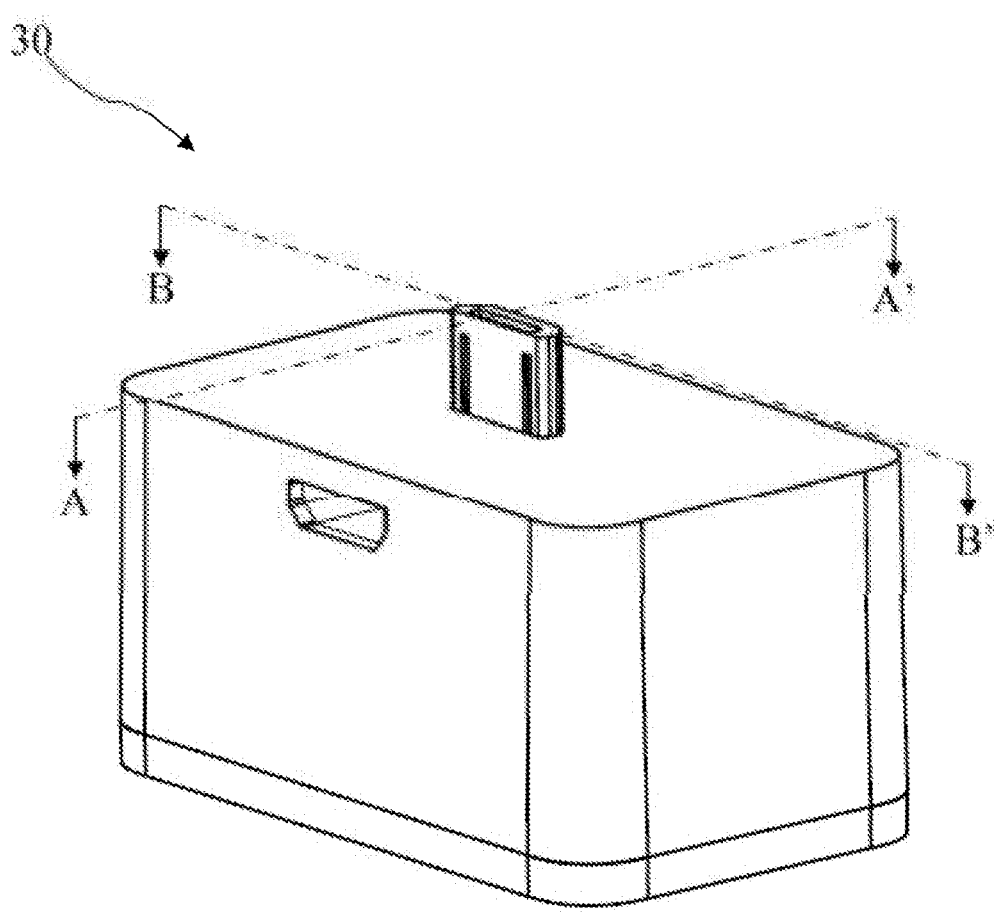
FIG. 3A is a three-dimensional diagram of a power supply device according to some embodiments of the present application.
Figure 3B:
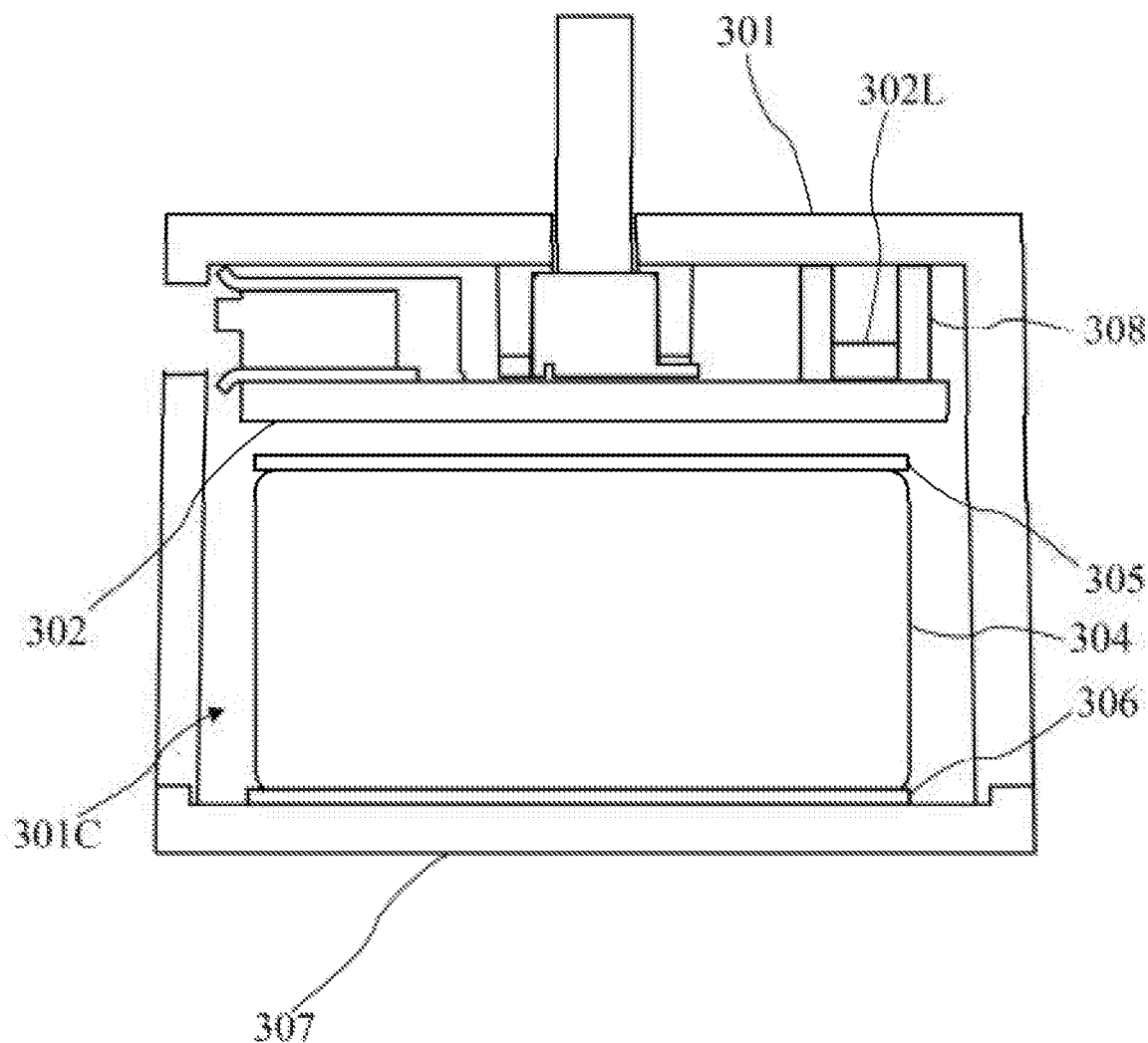
FIG. 3B is a cross-sectional view of the power supply device taken along line A-A' in FIG. 3A according to some embodiments of the present application.
Figure 3C:
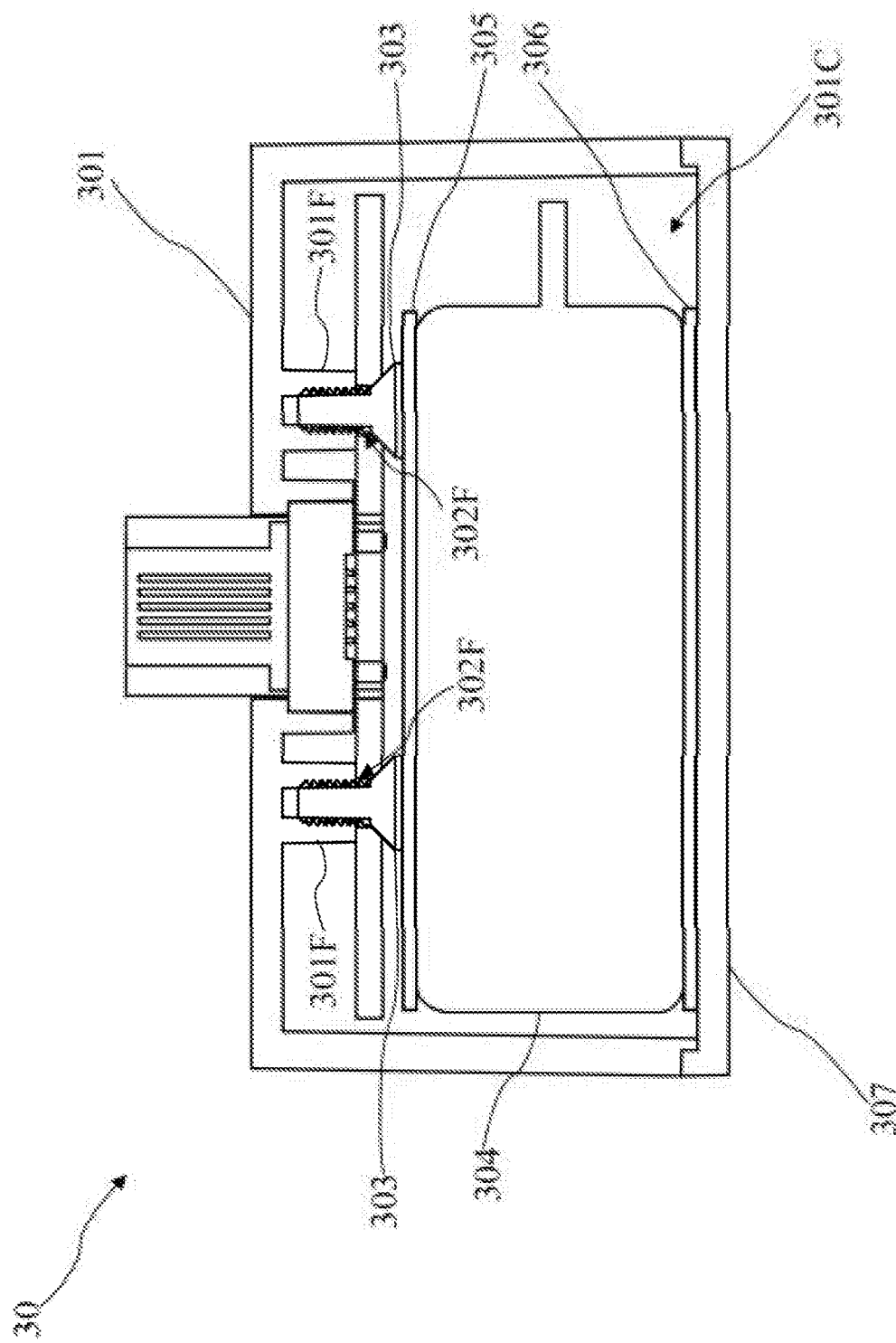
FIG. 3C is a cross-sectional view of the power supply device taken along line B-B' in FIG. 3A according to some embodiments of the present application.
Figure 3D:
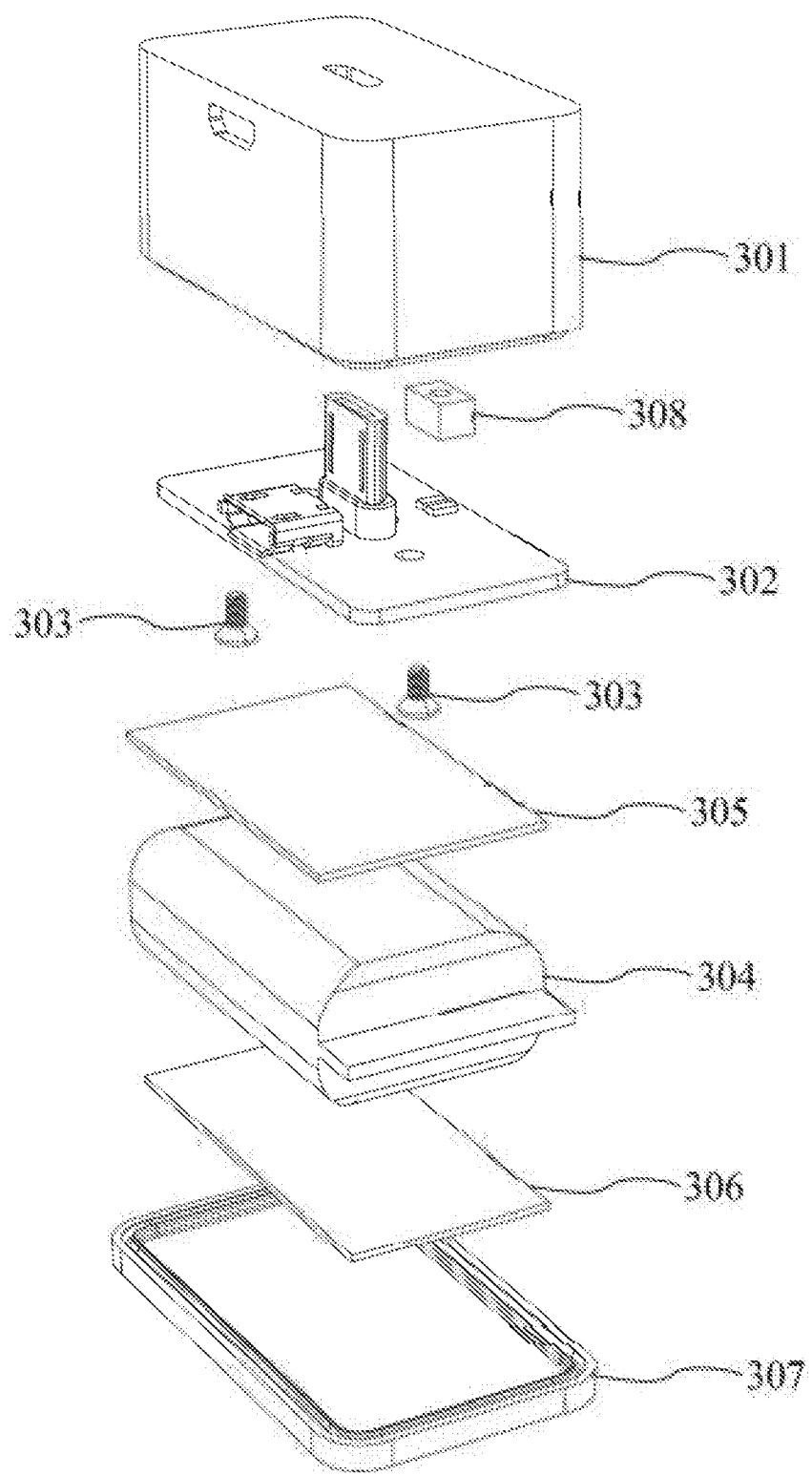
FIG. 3D is an exploded view of the power supply device according to some embodiments of the present application.

With reference to FIG. 3A to FIG. 3D, FIG. 3A is a three-dimensional diagram of a power supply device 30 according to the present application, FIG. 3B is a cross-sectional view of the power supply device 30 taken along line A-A' in FIG. 3A according to the present application, FIG. 3C is a cross-sectional view of the power supply device 30 taken along line B-B' in FIG. 3A according to the present application, and FIG. 3D is an exploded view of the power supply device 30 according to the present application. As shown in the figures, the power supply device 30 includes a housing 301, a circuit board 302, a connecting assembly 303, a power storage element 304, a buffer element 305, a buffer element 306 and a bottom cap 307. The housing 301 defines an accommodation space 301C, configured to accommodate the circuit board 302, the power storage element 304, the buffer element 305 and the buffer element 306.

Specifically, the housing 301 includes a housing positioning component 301F disposed in the accommodation space 301C. A circuit board positioning component 302F is formed on the circuit board 302. The connecting assembly 303 is configured to connect the housing positioning component 301F and the circuit board positioning component 302F, so as to fix the circuit board 302 in the accommodation space 301C of the housing 301.

In some embodiments, the connecting assembly 303 includes male parts (for example, two screws in the figures) of two fastener groups, the circuit board positioning component 302F includes two through holes, and the housing positioning component 301F includes female parts (for example, two screw holes in the figures) of the fastener groups corresponding to the connecting assembly 303. Therefore, after the two male parts are respectively passed through the two through holes of the circuit board 302 and connected to the female parts of the housing 301, the circuit board 302 is fixed in the accommodation space 301C of the housing 301.

In addition, the accommodation space 301C of the housing 301 further includes a space configured to accommodate the power storage element 304, the buffer element 305, and the buffer element 306. As shown in the figures, in the accommodation space 301C, the circuit board 302 is disposed between a top surface of the housing 301 and the power storage element 304, and the power storage element 304 is disposed between the circuit board 302 and a bottom portion of the housing 301.

Further, the buffer element 305 is disposed between the circuit board 302 and the power storage element 304, and configured to prevent hard contact between the circuit board 302 and the power storage element 304, so as to prevent the elements from possible damage caused by collision. In some embodiments, a surface of the buffer element 305 is opposite to a surface of the power storage element 304, and the area of the surface of the buffer element 305 is substantially equal to the area of the surface of the power storage element 304. In this way, by designing the buffer element 305 to completely cover the power storage element 304, the buffering function of the buffer element 305 is maximized. In addition, the buffer element 305 is also configured to prevent hard contact between the connecting assembly 303 and the power storage element 304.

On the other hand, the buffer element 306 is disposed between the power storage element 304 and the bottom cap 307 at the bottom portion of the housing 301, and configured to prevent hard contact between the power storage element 304 and the bottom cap 307, so as to prevent the elements from possible damage caused by collision. In some embodiments, a surface of the buffer element 306 is opposite a surface of the power storage element 304, and the area of the surface of the buffer element 306 is substantially equal to the area of the surface of the power storage element 304. In this way, by designing the buffer element 306 to completely cover the power storage element 304, the buffering function of the buffer element 306 is maximized.

In some embodiments, the bottom cap 307 is removably disposed at the bottom portion of the housing 301, and configured to close the housing 301 after elements (for example, the circuit board 302, the connecting assembly 303, the power storage element 304, the buffer element 305 and the buffer element 306) are disposed in the housing 301.

Figure 3E:
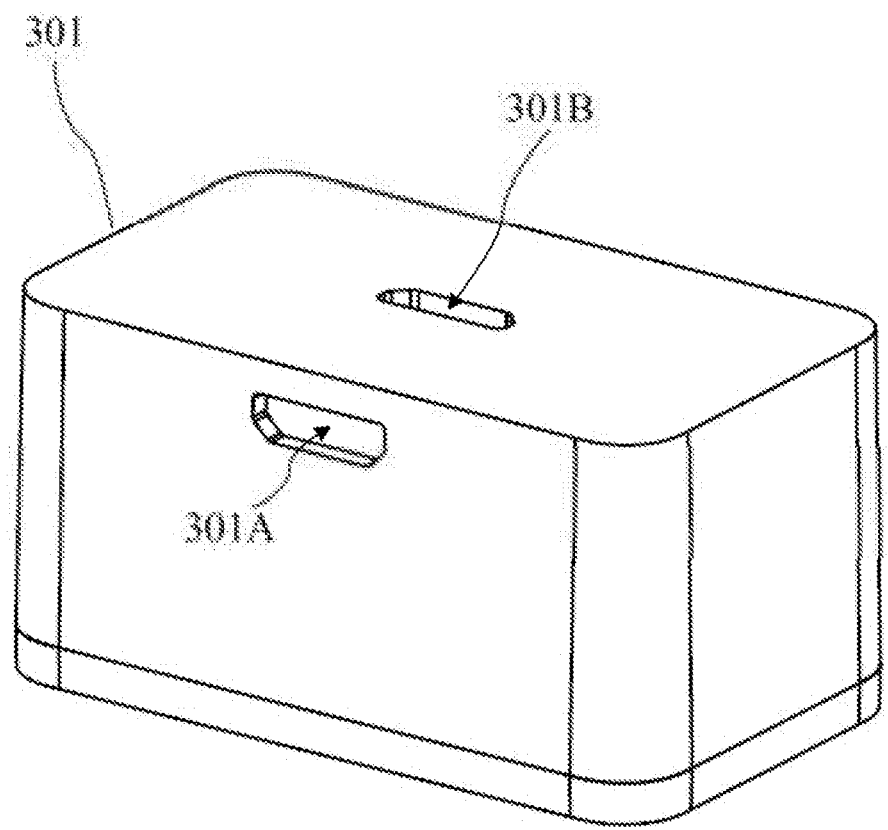
FIG. 3E is a three-dimensional diagram of a housing of the power supply device according to some embodiments of the present application.
Figure 3F:
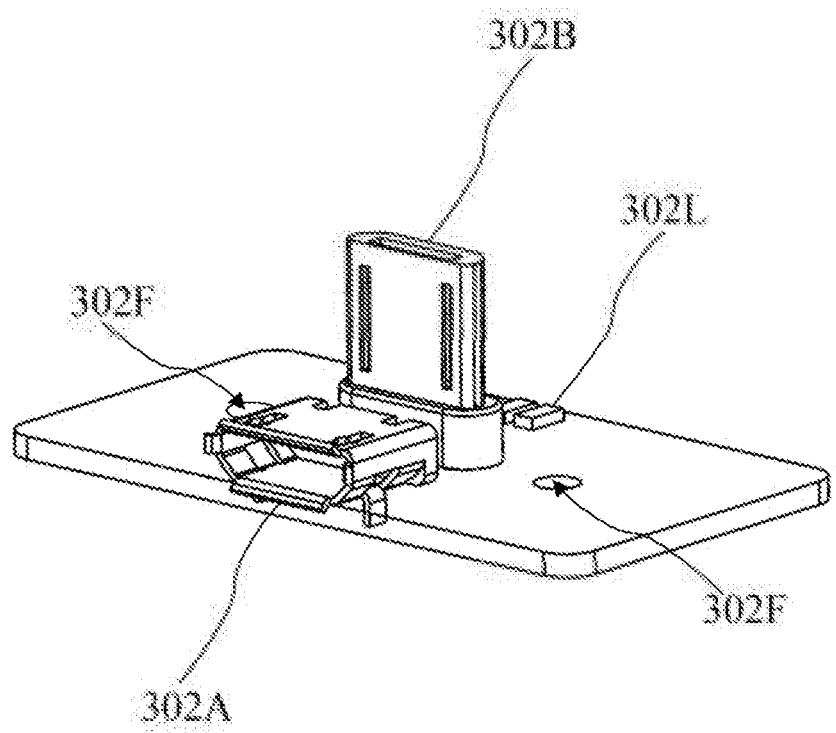
FIG. 3F is a three-dimensional diagram of a circuit board of the power supply device according to some embodiments of the present application.
Figure 3G:
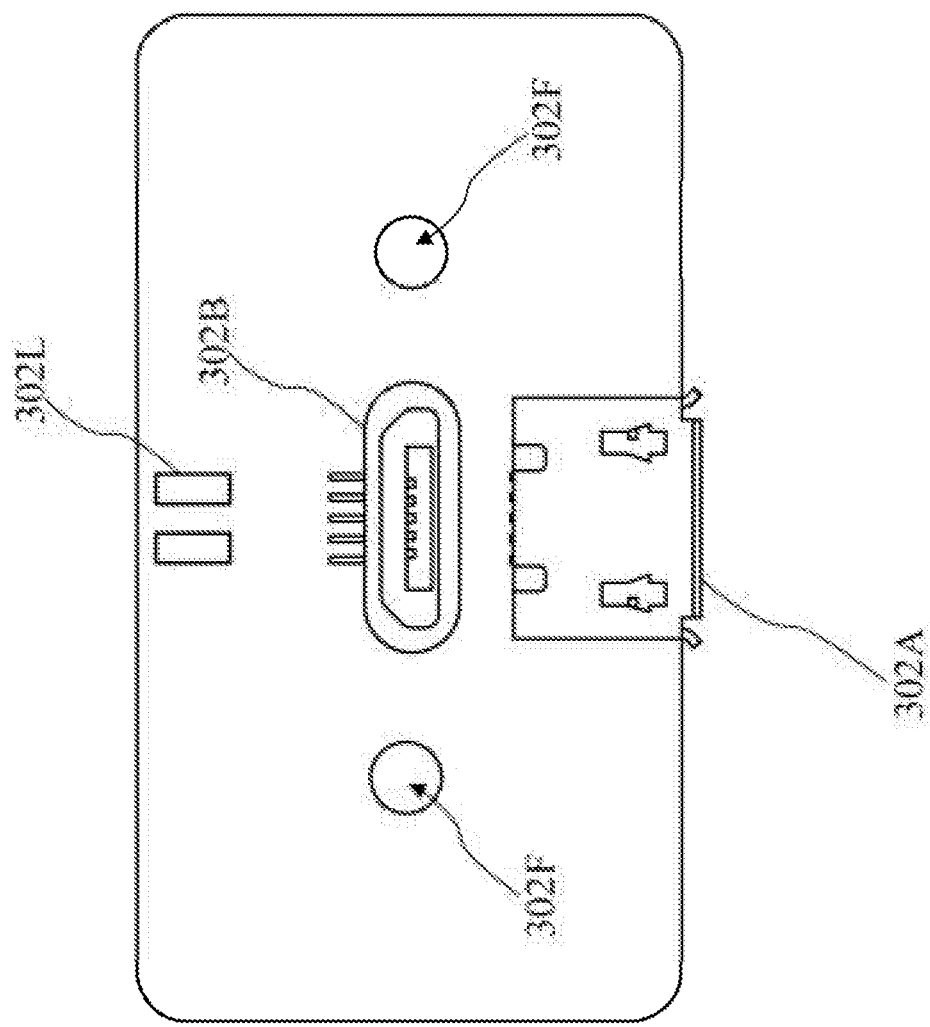
FIG. 3G is a top view of the circuit board of the power supply device according to some embodiments of the present application.
Figure 3H:
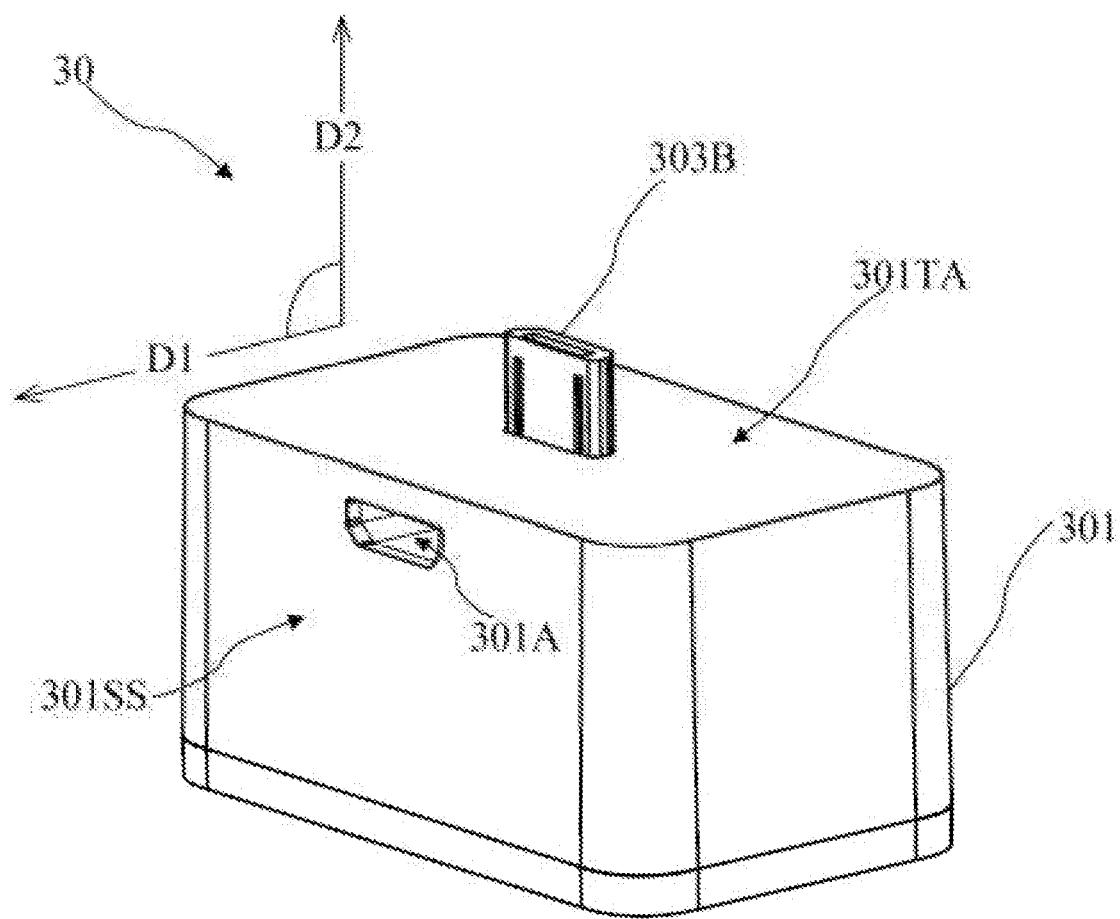
FIG. 3H is another three-dimensional diagram of the power supply device according to some embodiments of the present application.

With reference to FIG. 3E to FIG. 3H, FIG. 3E is a three-dimensional diagram of the housing 301 according to the present application, FIG. 3F is a three-dimensional diagram of the circuit board 302 according to the present application, FIG. 3G is a top view of the circuit board 302 according to the present application, and FIG. 3H is another three-dimensional diagram of the power supply device 30 according to the present application. As shown in FIG. 3E, an opening 301A and an opening 301B are formed on the housing 301. As shown in FIG. 3F and FIG. 3G, an electronic element is configured on the circuit board 302. The electronic element includes a power input port 302A, a power output port 302B, and a light emitting element 302L. The circuit board positioning component 302F is disposed on two sides of the power output port 302B. As shown in FIG. 3H, when the circuit board 302 is fixedly disposed in the accommodation space 301C of the housing 301, the position of the power input port 302A corresponds to the position where the opening 301A is formed in the housing 301, and the position of the power output port 302B corresponds to the position where the opening 301B is formed in the housing 301. Therefore, the power input port 302A is exposed to the opening 301A, and the power output port 302B is exposed to the opening 301B.

In this way, through the opening 301A, the power input port 302A is connected to a power input element (for example, a transformer) by a transmission wire, and receives power supplied by the power input element. The power input port 302A is electrically connected to the power output port 302B through a circuit on the circuit board 302. The circuit converts the power and provides the converted power to the power output port 302B. On the other hand, through the opening 301B, the power output port 302B is connected to an electronic device, and provides the converted power to the electronic device (for example, an electronic cigarette). In some embodiments, the power output port 302B is a male port, which extends through the opening 302B and protrudes from an outer surface of the housing 301 to connect to a female port of the electronic device.

In some embodiments, the light emitting element 302L is electrically connected to the power input port 302A and the power output port 302B. When the power input port 302A receives power from the power input element or when the power output port 302B outputs power to the electronic device, the light emitting element 302L starts to emit light. In short, the light emitting element 302L is configured to indicate that the power supply device 30 is in use.

In some embodiments, the power supply device 30 further includes a light-emitting-element shield 308. The light-emitting-element shield 308 is disposed on the circuit board 302 and corresponding to the light emitting component 302L, and configured to cover the light emitting component 302L. When covering the light emitting element 302L, the light-emitting-element shield 308 can guide and concentrate the light emitted by the light emitting element 302L, thereby enhancing the indicator effect of the light emitting element 302L.

In some embodiments, the power storage element 304 is electrically connected to the power input port 302A and the power output port 302B of the circuit board 302. The power storage element 304 is configured to: store the power supplied by the power input element through the power input port 302A, and supply the stored power to the electronic device when the electronic device is connected to the power output port 302B.

In some embodiments, the opening 301B is formed on a top surface 301TS of the housing 301, and the opening 301A is formed on a side surface 301SS of the housing 301. The top surface 301TS is adjacent to the side surface 301SS. However, the power input port 302A receives a power input element along a direction D1, and the power output port 302B receives an electronic device along a direction D2. In some embodiments, an angle between the direction D1 and the direction D2 is 45 degrees to 135 degrees. In some embodiments, the angle between the direction D1 and the direction D2 is approximately 45 degrees, 60 degrees, 75 degrees or 90 degrees.

In some embodiments, the material of the buffer element 305, the buffer element 306, and the light-emitting-element shield 308 includes an ethylene-vinyl acetate copolymer. In some embodiments, the power input port 101A, 201A or 301A includes one of a universal serial bus (USB) input port, a mini USB input port, a micro USB input port, or a USB-C input port. In some embodiments, the power output port 101B, 201B or 301B includes one of a USB output port, a mini USB output port, a micro USB output port or a USB-C output port.

Based on the above, the present application provides some power supply devices of a size and design that are more suitable for carrying. In addition, some power supply devices provided by the present application not only have real-time power receiving and charging functions, but also can store power for future use.

It should be noted that the implementation of the power supply device of the present application is not limited to the foregoing embodiments, and power supply devices composed of different element combinations shall all be possible implementation aspects. Therefore, any modification, equivalent replacement, or improvement made without departing from the spirit and principle of the present application shall fall within the protection scope of the present application.

What is claimed is:

1. A power supply device, comprising:
   a housing, defining an accommodation space, and comprising:
     a housing positioning component, disposed in the accommodation space; and
     a first opening and a second opening;
   a circuit board, disposed in the accommodation space, and comprising:
     a power input port, mounted on the circuit board and disposed corresponding to the first opening; and
     a power output port, mounted on the circuit board and disposed corresponding to the second opening, and electrically connected to the power input port; and
     a circuit board positioning component, formed on the circuit board and adjacent to one side of the power output port; and
   a connecting assembly, configured to connect the housing positioning component and the circuit board positioning component, and configured to position the circuit board in the accommodation space of the housing.

2. The power supply device according to claim 1, wherein the first opening is formed on a top surface of the housing, the second opening is formed on a side surface of the housing, and the top surface and the side surface are adjacent to each other.

3. The power supply device according to claim 2, wherein the power input port receives a power input element along a first direction, the power output port receives an electronic device along a second direction, and an angle between the first direction and the second direction is about 45 degrees to 135 degrees.

4. The power supply device according to claim 1, wherein the power output port extends through the first opening, and protrudes from an outer surface of the housing.

5. The power supply device according to claim 1, wherein the housing further comprises:
   a bottom cap, removably disposed at a bottom portion of the housing.

6. The power supply device according to claim 1, wherein the circuit board further comprises:
   a light emitting element, disposed on the circuit board, and electrically connected to the power input port and the power output port.

7. The power supply device according to claim 6, further comprising:
   a light-emitting-element shield, disposed on the circuit board and corresponding to the light emitting element, and configured to cover the light emitting element.

8. The power supply device according to claim 7, wherein the material of the light-emitting-element shield comprises an ethylene-vinyl acetate copolymer.

9. The power supply device according to claim 1, further comprising:
   a power storage element, disposed in the accommodation space, and electrically connected to the power input port.

10. The power supply device according to claim 9, wherein in the accommodation space, the circuit board is disposed between the top surface of the housing and the power storage element.

11. The power supply device according to claim 10, further comprising:
   a buffer element, disposed in the accommodation space, and disposed between the power storage element and the circuit board.

12. The power supply device according to claim 11, wherein a surface of the buffer element is opposite a surface of the power storage element, and the area of the surface of the buffer element is substantially equal to the area of the surface of the power storage element.

13. The power supply device according to claim 11, wherein the material of the buffer element comprises an ethylene-vinyl acetate copolymer.

14. The power supply device according to claim 10, further comprising:
   a buffer element, disposed in the accommodation space, and disposed between the power storage element and the bottom cap of the housing.

15. The power supply device according to claim 14, wherein a surface of the buffer element is opposite to a surface of the power storage element, and the area of the surface of the buffer element is substantially equal to the area of the surface of the power storage element.

16. The power supply device according to claim 14, wherein the material of the buffer element comprises an ethylene-vinyl acetate copolymer.

17. The power supply device according to claim 1, wherein the connecting assembly comprises at least one screw, the circuit board positioning component comprises at least one through hole, the housing positioning component comprises at least one screw hole corresponding to the at least one through hole, and the at least one screw extends through the at least one through hole and is connected to the at least one screw hole.

18. The power supply device according to claim 1, wherein the connecting assembly comprises two screws, the circuit board positioning component comprises two through holes, the housing positioning component comprises two screw holes corresponding to the two through holes, and the two screws respectively extend through the two through holes and are connected to the two screw holes.

19. The power supply device according to claim 18, wherein the two through holes are respectively disposed on two sides of the power output port.

20. The power supply device according to claim 1, wherein the power output port comprises one of a universal serial bus (USB) output port, a mini USB output port, a micro USB output port or a USB-C output port.

21. The power supply device according to claim 1, wherein the power input port comprises one of a USB input port, a mini USB input port, a micro USB input port or a USB-C input port.

* * * * *